US010090259B2

(12) United States Patent
Malatkar et al.

(10) Patent No.: US 10,090,259 B2
(45) Date of Patent: Oct. 2, 2018

(54) NON-RECTANGULAR ELECTRONIC DEVICE COMPONENTS

(71) Applicant: Intel Corporation, Santa Clara, CA (US)

(72) Inventors: Pramod Malatkar, Chandler, AZ (US); Sairam Agraharam, Chandler, AZ (US); Shawna Liff, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,835

(22) Filed: Dec. 26, 2015

(65) Prior Publication Data

US 2017/0186705 A1    Jun. 29, 2017

(51) Int. Cl.
*H01L 23/04* (2006.01)
*H01L 23/00* (2006.01)
(Continued)

(52) U.S. Cl.
CPC ...... *H01L 23/564* (2013.01); *H01L 21/02002* (2013.01); *H01L 21/78* (2013.01);
(Continued)

(58) Field of Classification Search
CPC ..... H01L 21/67383; H01L 2224/32225; H01L 2224/75967; H01L 2924/3511;
(Continued)

(56) References Cited

U.S. PATENT DOCUMENTS 3,219,748 A * 11/1965 Miller ................ H01L 23/045
174/560
5,434,750 A * 7/1995 Rostoker ............ G03F 7/70433
257/666
(Continued)

FOREIGN PATENT DOCUMENTS

JP        2001/358369 A     12/2001

OTHER PUBLICATIONS

International Search Report and Written Opinion for PCT application No. PCT/US2016/063799; filing date Nov. 26, 2016; dated Mar. 1, 2017; 12 pages.

*Primary Examiner* — S. V. Clark
(74) *Attorney, Agent, or Firm* — Thorpe North and Western, LLP; David W. Osborne

(57) ABSTRACT

Electronic device shape configuration technology is disclosed. In an example, an electronic device substrate is provided that can comprise a top surface, and a bottom surface opposing the top surface. The top surface and/or the bottom surface can have a non-rectangular shaped perimeter. An electronic device die is also provided that can comprise a top surface, and a bottom surface opposing the top surface. The top surface and/or the bottom surface can have a non-rectangular shaped perimeter. In addition, an electronic device package is provided that can comprise a substrate having a top surface configured to receive a die and a bottom surface opposing the top surface. The package can also include a die having a top surface and a bottom surface opposing the top surface. The die can be coupled to the top (Continued)

surface of the substrate. The top surface and/or the bottom surface of either the substrate, or the die, or both can have a non-rectangular shaped perimeter.

10 Claims, 7 Drawing Sheets

(51) Int. Cl.
    *H01L 23/498*      (2006.01)
    *H01L 21/78*      (2006.01)
    *H01L 23/13*      (2006.01)
    *H01L 21/02*      (2006.01)
    *H01L 29/06*      (2006.01)
    *H05K 1/02*      (2006.01)

(52) U.S. Cl.
    CPC ........ *H01L 23/13* (2013.01); *H01L 23/49838* (2013.01); *H01L 23/562* (2013.01); *H01L 24/80* (2013.01); *H01L 29/0657* (2013.01); *H05K 1/02* (2013.01); *H01L 2924/10155* (2013.01); *H01L 2924/15158* (2013.01)

(58) Field of Classification Search
    CPC ........... H01L 2224/16225; H01L 33/54; H01L 23/12; H01L 25/072; H01L 25/115
    USPC ............... 257/701, 702, 730, 731, 773, 798; 438/125
    See application file for complete search history.

(56) References Cited

U.S. PATENT DOCUMENTS

| | | | |
|---|---|---|---|
| 5,532,934 A | 7/1996 | Rostoker | |
| 5,536,177 A * | 7/1996 | Casey | H05K 7/023 439/74 |
| 5,841,638 A * | 11/1998 | Purdom | H05K 1/144 206/305 |
| 5,981,036 A * | 11/1999 | Schulz-Harder | H01L 23/13 257/E23.004 |
| 6,160,326 A * | 12/2000 | Iversen | H01L 23/467 257/107 |
| 6,178,654 B1 * | 1/2001 | Kanatake | H01L 21/68 257/618 |
| 6,245,630 B1 * | 6/2001 | Ishikawa | C30B 25/18 257/618 |
| 6,331,730 B1 * | 12/2001 | Terasaki | H01L 23/049 257/658 |
| 6,979,895 B2 * | 12/2005 | Akram | H05K 1/144 257/678 |
| 7,215,557 B2 * | 5/2007 | Glovatsky | H05K 1/144 361/748 |
| 7,898,080 B2 * | 3/2011 | Otremba | H01L 24/40 257/685 |
| 8,942,005 B2 * | 1/2015 | Geswender | F42B 15/08 361/792 |
| 2002/0135050 A1 * | 9/2002 | Kimura | H01L 23/4985 257/668 |
| 2005/0024813 A1 * | 2/2005 | Shimizu | H01G 4/38 361/328 |
| 2005/0082663 A1 * | 4/2005 | Wakiyama | H01L 23/5387 257/717 |
| 2005/0158967 A1 * | 7/2005 | Huang | H01L 21/78 438/460 |
| 2006/0091520 A1 * | 5/2006 | Akram | H01L 23/3185 257/686 |
| 2006/0103544 A1 * | 5/2006 | Merz | F21K 9/00 340/815.45 |
| 2009/0011548 A1 * | 1/2009 | Iimura | H01L 21/481 438/123 |
| 2010/0047961 A1 * | 2/2010 | Ruszowski | H05K 3/303 438/106 |
| 2010/0078811 A1 * | 4/2010 | Meyer-Berg | H01L 21/561 257/738 |
| 2010/0296358 A1 * | 11/2010 | Lee | G11C 7/22 365/230.06 |
| 2011/0108982 A1 * | 5/2011 | Kim | H05K 3/3436 257/737 |
| 2013/0009179 A1 * | 1/2013 | Bhat | H05K 1/0209 257/89 |
| 2014/0339672 A1 * | 11/2014 | Yano | H01L 21/78 257/499 |
| 2015/0084213 A1 * | 3/2015 | Heng | H01L 24/19 257/787 |
| 2016/0079553 A1 * | 3/2016 | Yamazaki | H01L 51/52 257/99 |
| 2016/0149093 A1 * | 5/2016 | Konishi | F21K 9/00 257/88 |

* cited by examiner

NON-RECTANGULAR ELECTRONIC DEVICE COMPONENTS

TECHNICAL FIELD

Embodiments described herein relate generally to electronic devices.

BACKGROUND

As personal computing devices continue to develop, new device form factors are being introduced. For example, wearable computing technology is providing new shapes for users to facilitate use of the devices on or about a human body. In addition, smartphones and tablets may take on non-traditional shapes as these technologies develop.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
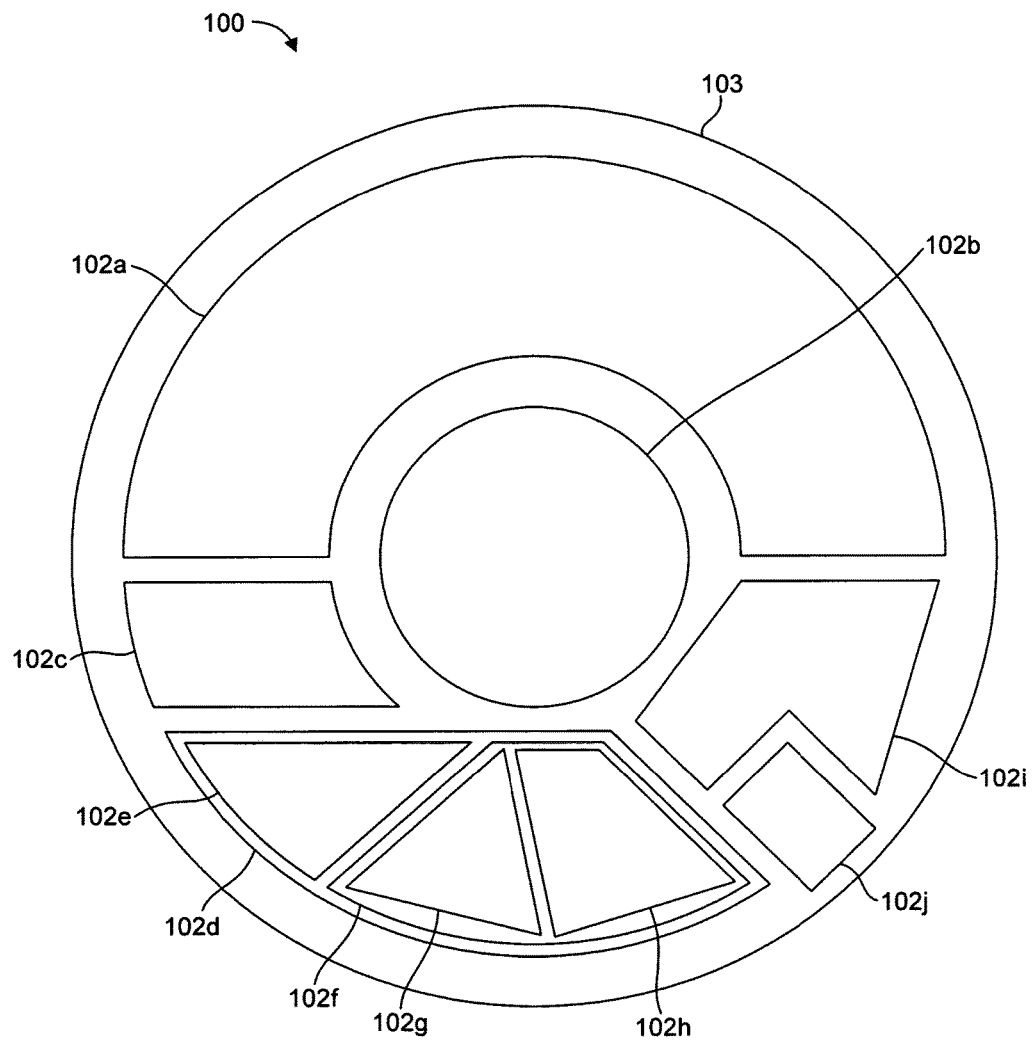
FIG. 1 illustrates a schematic plan view representation of an exemplary electronic device.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a die" includes a plurality of such dies.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term, like "comprising" or "including," in this specification it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

While the external form factors of many electronic devices have changed to accommodate new uses or to better meet user needs, the form factors or shapes of the internal electronic components of these devices has remained substantially the same rectangular or square shape or form factor. Fitting rectangular shaped electronic components within a non-rectangular device form factor on a non-rectangular motherboard can be challenging and can result in inefficient use of the available space.

Certain invention embodiments provide electronic components that can facilitate better use of the space available associated with a non-rectangular electronic device form factor. In one aspect, an electronic device substrate is provided that can comprise a top surface, and a bottom surface opposing the top surface. The top surface and/or the bottom surface can have a non-rectangular shaped perimeter. An electronic device die is also provided that can comprise a top surface, and a bottom surface opposing the top surface. The top surface and/or the bottom surface can have a non-rectangular shaped perimeter. In addition, an electronic device package is provided that can comprise a substrate having a top surface configured to receive a die and a bottom surface opposing the top surface. The package can also include a die having a top surface and a bottom surface opposing the top surface. The die can be coupled to the top surface of the substrate. The top surface and/or the bottom surface of either the substrate, or the die, or both can have a non-rectangular shaped perimeter. In addition to facilitating an effective use of space, the principles of the present disclosure can also provide other advantages, such as improved I/O routing, improved reliability, and lower warpage during mounting of electronic components, which are described in more detail hereinafter.

Referring to FIG. 1, an exemplary electronic device 100 is illustrated. The electronic device 100 can include one or more generic items 102*a*-*j*. The items 102*a*-*j* can be directly or indirectly coupled to a motherboard 103 or other suitable substrate. The items 102*a*-*j* can represent any suitable device or component that can be included in an electronic device or operably coupled to the motherboard 103. Such items include without limitation a processor, a memory device, a die (which can include one or more processors and/or memory devices), an electronic device package (which can include one or more dies), a radio, a heat sink, a port, a slot, an input/output (I/O), a connector, a socket, an LED, a capacitor, a resistor, a substrate (e.g., for a package or an embedded multi-die interconnect bridge (EMIB)), etc. An electronic device package can be a system in a package (SiP), a package on package (PoP), and/or any other suitable package configuration. The electronic device 100 can comprise any type of electronic device, such as a computing system (e.g., a desktop computer, a laptop computer, a tablet computer, a smartphone, a smartwatch, a server, etc.).

The motherboard 103 can have any suitable shape or configuration, such as a rectangular or non-rectangular shape. As illustrated in FIG. 1 the motherboard 103 has a non-rectangular perimeter shape. In this case, the perimeter shape of the motherboard 103 is a circular shape, although the motherboard can have any suitable non-rectangular shape, such as a semi-circular shape, an elliptical shape, a polygonal shape (e.g., a triangular shape, a quadrilateral shape, a pentagonal shape, a hexagonal shape, a heptagonal shape, an octagonal shape, etc.), a curvilinear shape, and/or a free form shape.

Similarly, the items 102a-j can have rectangular or non-rectangular shaped perimeters of any suitable shape, such as a circular shape (e.g., item 102b), a semi-circular shape (e.g., items 102a, 102c-f), an elliptical shape, a polygonal shape (e.g., items 102g-j), a curvilinear shape (e.g., items 102a, 102c-f), and/or a free form shape. A polygonal shape can be a triangular shape, a quadrilateral shape, a pentagonal shape, a hexagonal shape, a heptagonal shape, an octagonal shape, etc. The combination of perimeter shapes of the items 102a-j can be selected to maximize the number of items coupleable to the motherboard 103. For example, based on the size and shape of the motherboard 103, which may be rectangular or non-rectangular, the size and shape configurations of the items 102a-j can be selected to maximize the density of the items on the motherboard 103. In one aspect, the perimeter shapes of two or more of the items 102a-j can be complementary such that the shapes combine to form a shape that maximizes the density of the items on the motherboard 103 or on another item or component, as the case may be.

Generally, the motherboard 103 and the items 102a-j can be any suitable shape, and any combination of motherboard 103 and item 102a-j shapes can be used in order to arrive at a device with specific properties, such as size and overall operation. For example, any suitable item shape (e.g., a package) can be selected for a given form factor shape of the electronic device and/or the motherboard to make efficient use of the available area. The ability to select or customize the shapes of the items in an electronic device or on a motherboard can provide flexibility in meeting the space constraints of the available area. In addition, because the items or components of an electronic device can be more efficiently packaged or arranged, the form factor of the electronic device can be made smaller, which can reduce costs and provide new or better uses for the device.

Figure 2A:
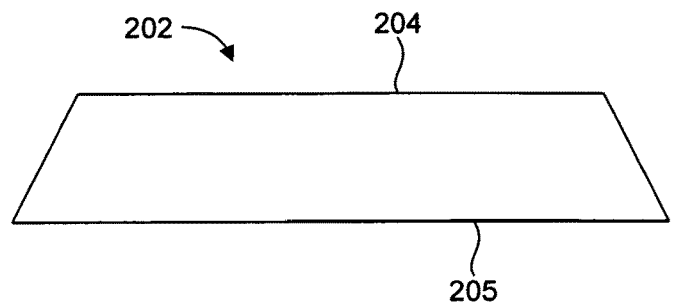
FIG. 2A illustrates a side view of an item or component of an exemplary electronic device.
Figure 2B:
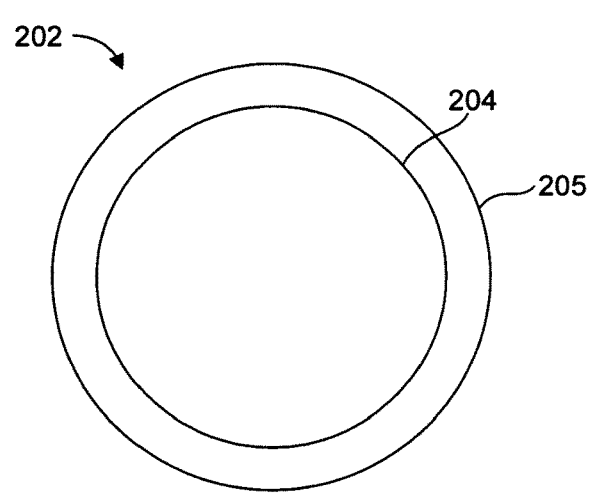
FIG. 2B illustrates a top view of the item or component of an exemplary electronic device.
Figure 3:
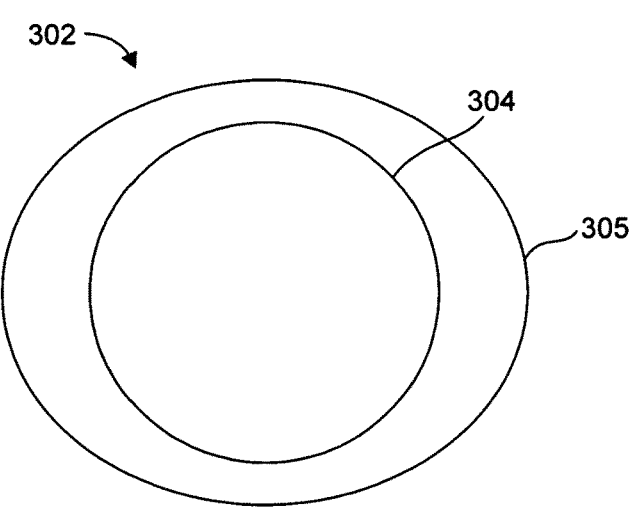
FIG. 3 illustrates a top view of an item or component of an exemplary electronic device.

Because FIG. 1 illustrates a schematic plan view representation of the electronic device 100, perimeter shapes of top and bottom surfaces of the motherboard 103 and the items 102a-j are not distinguished. Rather, the outer perimeter or boundary shapes of the motherboard 103 and the items 102a-j are represented in this figure. It should be recognized that top and bottom surfaces of the motherboard 103 and the items 102a-j may have perimeters that match in shape and/or size, or differ in shape and/or size. For example, FIGS. 2A and 2B illustrate an item 202 or component of an electronic device, such as a processor, a memory device, a die, an electronic device package, a radio, a heat sink, a port, a slot, an input/output (I/O), a connector, a socket, an LED, a capacitor, a resistor, a substrate (e.g., of a motherboard or a package), etc. The item 202 can have a top surface 204 and a bottom surface 205 opposing the top surface. The top and bottom surfaces 204, 205 can differ in size (e.g., perimeter dimension or area), as illustrated, or the top and bottom surfaces can be the same size. In this example, the top and bottom surfaces 204, 205 are similar in shape (i.e., circular). However, as shown in FIG. 3, an item 302 or component can have top and bottom surfaces 304, 305 that have different shapes (e.g., a circular top surface 304 and an elliptical bottom surface 305 as illustrated, hexagonal and octagonal, etc.). The top and bottom surfaces 304, 305 can be the same size or different in size, as desired.

Figure 4A:
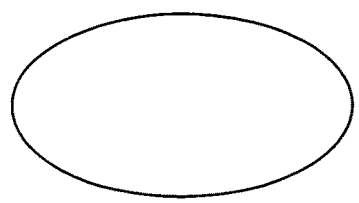
FIGS. 4A-4I illustrate shapes of items or components that can be incorporated into an exemplary electronic devices.
Figure 4B:
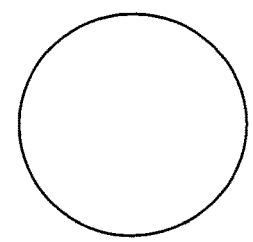
Figure 4C:
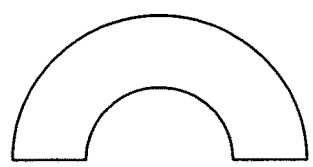
Figure 4E:
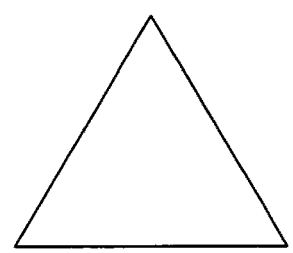
Figure 4D:
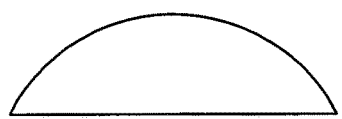
Figure 4F:
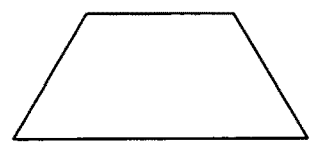
Figure 4G:
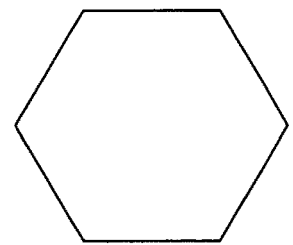
Figure 4H:
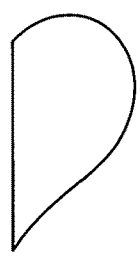
Figure 4I:
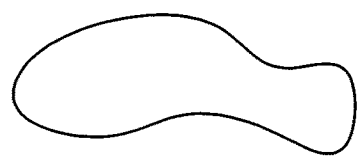

FIGS. 4A-4I illustrate several examples of possible shapes of items or components that can be incorporated into an electronic device as disclosed herein. For example, FIG. 4A illustrates an elliptical shape, FIG. 4B illustrates a circular shape, FIGS. 4C and 4D illustrate semi-circular shapes, FIG. 4E illustrates a triangular shape, FIG. 4F illustrates a quadrilateral shape, FIG. 4G illustrates a hexagonal shape, FIG. 4H illustrates a curvilinear shape, and FIG. 4I illustrates a free form shape. The shapes shown in these figures are merely examples and are not meant to be limiting in any way, as any suitable shape or configuration can be utilized.

Figure 5:
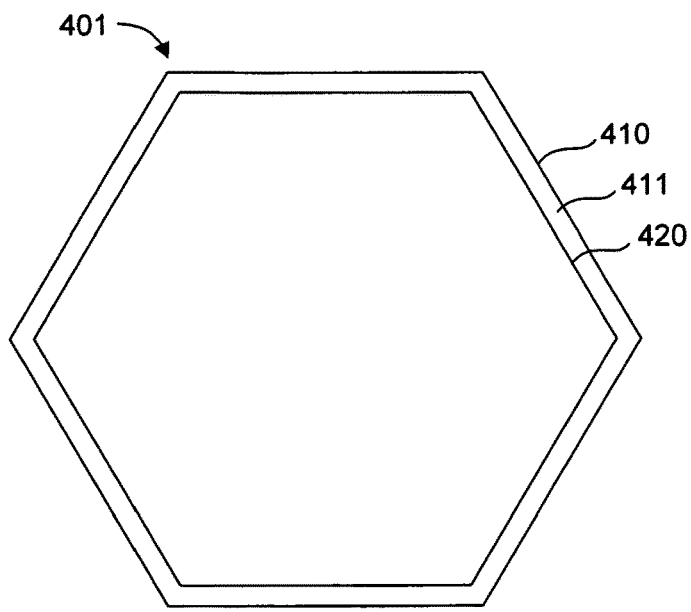
FIG. 5 illustrates an exemplary electronic device package.

FIG. 5 illustrates an electronic device package 401 in accordance with an example of the present disclosure. The electronic device package 401 can include a substrate 410 and a die 420. The substrate 410 can have a top surface 411 configured to receive the die 420 and the die 420 can be coupled to the top surface 411 of the substrate 410. Thus, the substrate 410 can have electronic circuitry (obscured from view by the die 420), which may be associated with the top surface 411, to electrically couple with the die 420. As discussed above and illustrated in FIGS. 2A-3, the substrate 410 and the die 420 can have rectangular or non-rectangular perimeter shapes, which can be defined by top and/or bottom surfaces of the substrate 410 and the die 420. As shown in FIG. 5, the substrate 410 and the die 420 can have non-rectangular shaped perimeters. In this case, the substrate 410 and the die 420 have matching non-rectangular shapes (e.g., a hexagonal shape). It should be recognized that either the substrate 410, the die 420, or both can have a non-rectangular shaped perimeter. It should also be recognized, as discussed above, that the perimeter shapes of either the substrate 410, the die 420, or both can comprise a circular shape, a semi-circular shape, an elliptical shape, a polygonal shape, a curvilinear shape, and/or a free form shape.

The shape of the package 401, which can be defined by the substrate 410 and/or the die 420, can be configured to maximize the number of packages coupled to a substrate (e.g., a motherboard) or other component to which the package 410 may be coupled, such as another package. The shape of the electronic device package 410 can therefore be selected based on a shape of a substrate or other component to which the package 410 may be coupled. In addition, the shape of the package 410 can be based on the shapes of other components or items which may be coupled to the same substrate or component in order to arrive at a device with specific properties, such as size and overall operation.

Figure 6:
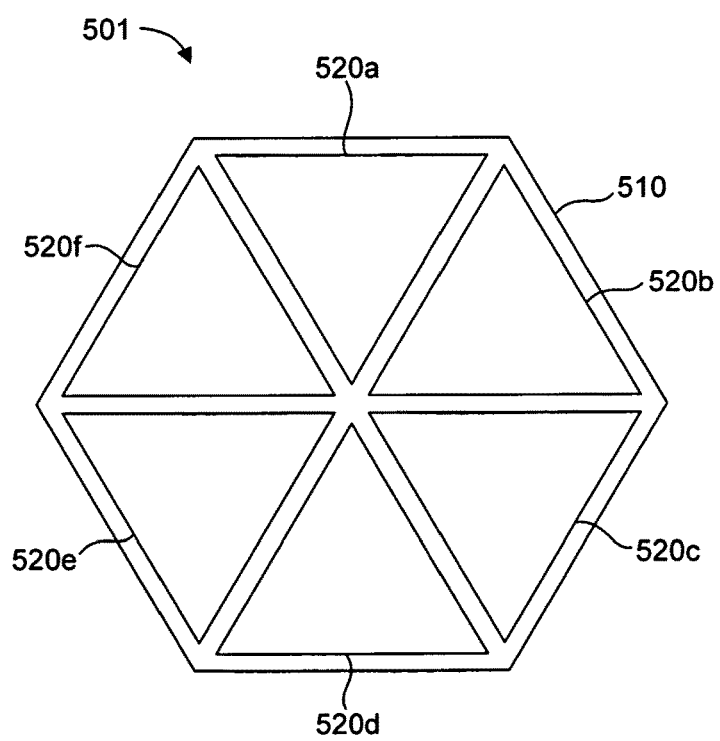
FIG. 6 illustrates an exemplary electronic device package.

FIG. 6 illustrates an electronic device package 501 in accordance with another example of the present disclosure. The electronic device package 501 can include a substrate 510 and multiple dies 520a-f, which are illustrated with non-rectangular shaped perimeters. The substrate 510 can have a different shape than the dies 520a-f. In this case, the substrate 510 has a hexagonal shape and the dies 520a-f have triangular shapes. The geometry is such that six triangular dies 520a-f can fit on the hexagonal substrate 510. The shape of the package 501, which can be defined by the substrate 510 and/or the dies 520a-f, can be configured to maximize the number of packages coupled to a substrate (e.g., a motherboard) or other component to which the package 501 may be coupled, such as another package. Thus, in one aspect, the shape of the substrate 510 can be configured to maximize the number of packages coupled to a substrate or other component. In another aspect, the shape of each of the dies 520a-f can be configured to maximize the number of dies coupled to the substrate 510. As shown in FIG. 6, the shapes of the dies 520a-f can be complementary to fit on the substrate 510. In this case, the shapes of the dies 520a-f match one another. It should be recognized, however, that the shapes of the dies can be different, as discussed above with respect to FIG. 1.

In one aspect, the principles disclosed herein provide for PoP arrangements. In the example illustrated in FIG. 6, for instance, the substrate 510 and the dies 520a-f can represent packages. Thus, multiple packages (triangular shaped in this case) can be mounted on or coupled to a common package (hexagonal shaped in this case) as part of an overall computing device. In general, one or more packages having a non-rectangular perimeter shape can be mounted on another package also having a rectangular or a non-rectangular perimeter shape. Any combination of shapes (e.g., rectangular or non-rectangular) can be used in this regard in order to arrive at a device with specific properties, such as size and overall operation.

Figure 7:
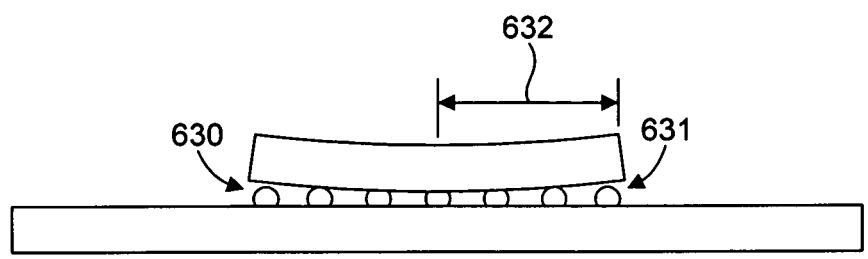
FIG. 7 illustrates a typical square or rectangular die experiencing warpage due to heat during the mounting or coupling process to a substrate.

In one aspect, a die or an electronic device package can be configured to provide lower corner solder joint stresses compared to a rectangular die or package of the same area. As illustrated in FIG. 7, a typical square or rectangular die is highly susceptible to warpage due to temperature variations. For such square or rectangular shaped dies, solder joint failures (e.g., non-contact electrical opens or electrical disconnects) often occur in the corner regions (indicated at 630, 631) of the die during the mounting process (i.e., surface mounting process) or when subjected to shock, vibration, transient bending, or other loading conditions. These failures are due to the distance 632 from the center of the die (e.g., increased warpage) and the presence of fewer solder joints located at that distance that can provide structural support for the die. The area of these failures therefore is typically along a periphery of a die. In order to maximize surface mount (SMT) yield and effectively minimize warpage and solder joint failure or areas of lost electrical contact (i.e. electrical opens), the number of corners of a die can be increased or corners on the shape of a die can be eliminated altogether. This can reduce the distance from the center of a die to a corner or edge of the die (e.g., reduced warpage), which can provide an increased number of solder joints at corner or edge regions to distribute or share the load. Thus, for example, a hexagonal or circular shaped die can provide lower solder joint stresses at a corner or edge compared to a rectangular die of the same area, which can improve production yields (e.g., fewer failures during surface mounting processes) as well as provide increased resistance to failure under a variety of loading conditions. In one aspect, the perimeter of a die can have a shape that maximizes perimeter length for a given area. This increased perimeter length can also provide benefits for routing of traces or other electrical contacts by providing more space or options for connections.

Figure 8:
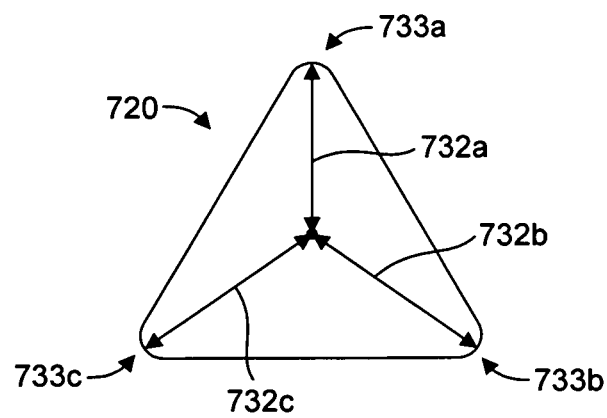
FIG. 8 illustrates an exemplary electronic device die.

In some cases, the overall perimeter shape of a die may be constrained by shape considerations as disclosed herein, such as to fit on a given substrate alone or with other components. In this case, corners of the die can be reduced or eliminated by rounding or chamfering in order to reduce the distance from the center of the die to the corner or an edge of the die. An example of this is illustrated in FIG. 8, where corners 733a-c of a triangular shaped die 720 are rounded. Rounding of the corners of the die 720 can reduce stress concentrations and prevent corner chipping or cracking during the assembly process. In one aspect, by eliminating the "point" of the corners 733a-c, distances 732a-c from a center of the die 720 to the corner 733a-c, respectively, can be reduced, thereby improving solder joint reliability and performance under shock, vibration, and transient bending loading conditions, as discussed above. It should be recognized that these principles also apply to substrates and packages or any other component coupled to another component via a solder coupling.

In one aspect, invention embodiments can maximize use of a round wafer in producing dies. Once one or more non-rectangular perimeter shapes and sizes for a die have been selected as described above, a maximum number of the die units can be identified that will fit on a surface of the round wafer. This can involve orienting units of the selected shape(s) and size(s) in relation to the wafer surface. The dies can then be formed from the wafer. Similarly, in the case of substrates, which are typically made from rectangular panels, once one or more non-rectangular perimeter shapes and sizes for a substrate have been selected as described above, the maximum number of the substrate units can be identified that will fit on a surface of the rectangular panel. This can involve orienting units of the selected shape(s) and size(s) in relation to the panel surface. The substrates can then be formed from the panel.

Figure 9A:
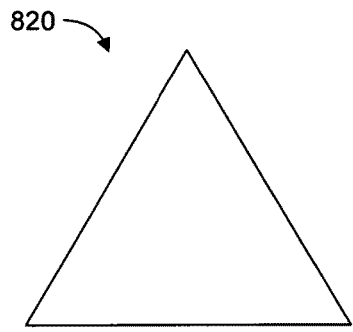
FIG. 9A illustrates a non-rectangular shaped exemplary electronic device die.
Figure 9B:
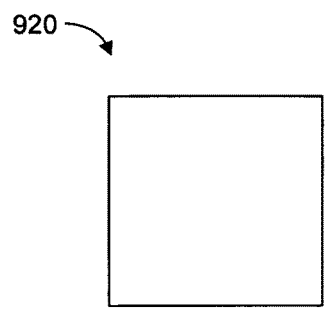
FIG. 9B illustrates a typical rectangular shaped electronic device die.
Figure 10A:
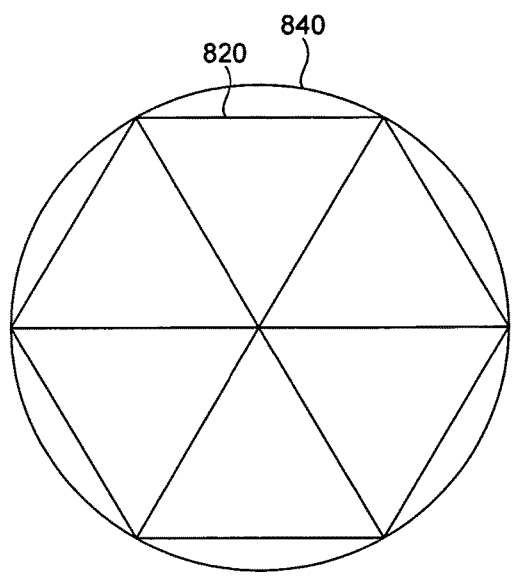
FIG. 10A illustrates a exemplary configuration for forming units of the non-rectangular shaped electronic device die from a round wafer.
Figure 10B:
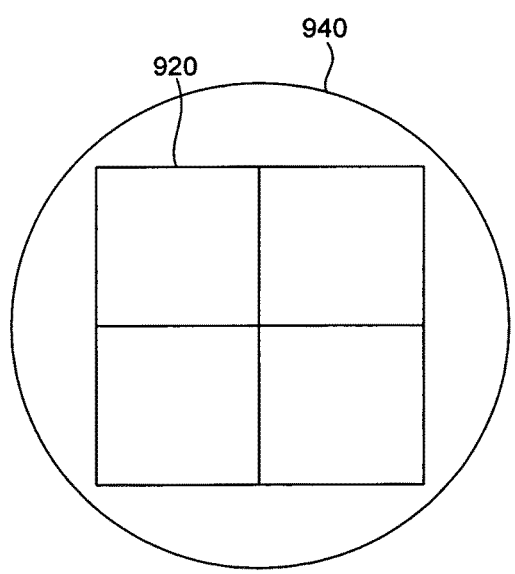
FIG. 10B illustrates an exemplary configuration for forming units of the typical rectangular shaped electronic device die from a round wafer.
Figure 11A:
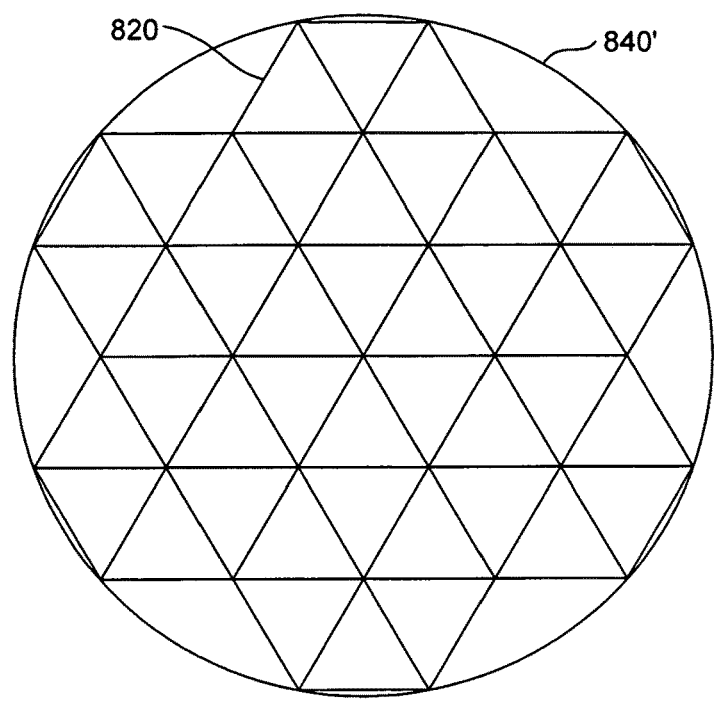
FIG. 11A illustrates an exemplary configuration for forming units of the non-rectangular shaped electronic device die from a round wafer.
Figure 11B:
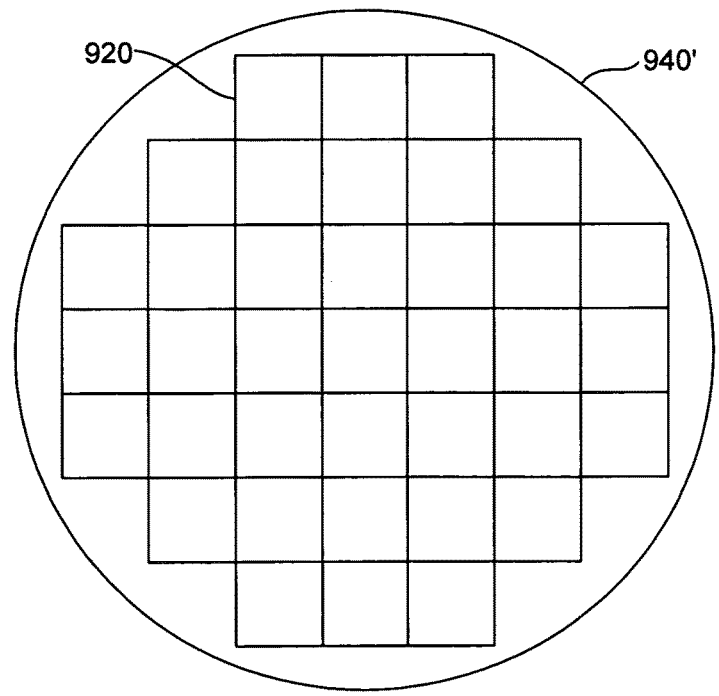
FIG. 11B illustrates another exemplary configuration for forming units of the typical rectangular shaped electronic device die from a round wafer.

These principles are illustrated in FIGS. 9A-11B in which a non-rectangular shaped die is compared to a typical rectangular shaped die. For example, FIG. 9A illustrates a non-rectangular shaped die 820 in the form of a triangle and FIG. 9B illustrates a rectangular shaped die 920 in the form of a square. The triangle shaped die 820 and the square shaped die 920 have the same area. FIGS. 10A and 10B show six of the triangle shaped dies 820 of the same shape and size, and four of the square shaped dies 920 of the same shape and size per wafer 840, 940, respectively. FIGS. 11A and 11B show 42 of the triangle shaped dies 820 and 37 of the square shaped dies 920 per wafer 840', 940', respectively. Thus, certain non-rectangular shaped geometries can be utilized to improve the yield of dies from a single wafer over traditional die shapes for a given die area. In one aspect, different sized and/or shaped dies can be combined to utilize even more of the wafer 840. Groups of six triangles as shown in FIGS. 10A and 11A can represent a hexagon shaped die as an illustration of how hexagon shaped dies may fit on a wafer. As mentioned above, non-rectangular geometries such as triangles and hexagons with large perimeters for a given area can be utilized as bridge stitching elements in EMIB or other die embedding technologies where a small area is utilized and a high I/O count is desired.

EXAMPLES

The following examples pertain to further embodiments.

In one example there is provided, an electronic device substrate comprising a top surface, and a bottom surface opposing the top surface, wherein at least one of the top surface and the bottom surface has a non-rectangular shaped perimeter.

In one example of an electronic device, the electronic device substrate can further comprise electronic circuitry.

In one example of an electronic device, the non-rectangular perimeter comprises a circular shape, a semi-circular shape, an elliptical shape, a polygonal shape, a curvilinear shape, a free form shape, or a combination thereof.

In one example of an electronic device, the polygonal shape comprises a triangular shape, a pentagonal shape, a hexagonal shape, a heptagonal shape, an octagonal shape, or a combination thereof.

In one example of an electronic device, the polygonal shape is a triangular shape.

In one example of an electronic device, the shape minimizes areas of lost electrical contact with a motherboard to which the substrate is coupled due to thermally induced warping of the substrate.

In one example of an electronic device, the area of lost electrical contact is along a periphery of the substrate.

In one example of an electronic device, the shape of the substrate is selected in order to maximize a number of substrates harvested from a single wafer or panel.

In one example of an electronic device, the perimeters of the top and bottom surfaces match in shape and size.

In one example of an electronic device, the perimeters of the top and bottom surfaces differ in shape or size.

In one example of an electronic device, the perimeter has a shape that maximizes perimeter length for a given area.

In one example of an electronic device, the shape is a polygon.

In one example of an electronic device, the shape is an ellipse.

In one example of an electronic device, the shape is a circle.

In one example there is provided, an electronic device die comprising a top surface, and a bottom surface opposing the top surface, wherein at least one of the top surface and the bottom surface has a non-rectangular shaped perimeter.

In one example of an electronic device die, the non-rectangular perimeter comprises a circular shape, a semi-circular shape, an elliptical shape, a polygonal shape, a curvilinear shape, a free form shape, or a combination thereof.

In one example of an electronic device die, the polygonal shape comprises a triangular shape, a pentagonal shape, a hexagonal shape, a heptagonal shape, an octagonal shape, or a combination thereof.

In one example of an electronic device die, the polygonal shape is a triangular shape.

In one example of an electronic device die, the shape minimizes areas of lost electrical contact with a package substrate or motherboard to which the die is coupled due to thermally induced warping of the die.

In one example of an electronic device die, the area of lost electrical contact is along a periphery of the die.

In one example of an electronic device die, the shape of the die is selected in order to maximize a number of dies harvested from a single wafer.

In one example of an electronic device die, the perimeters of the top and bottom surfaces match in shape and size.

In one example of an electronic device die, the perimeters of the top and bottom surfaces differ in shape or size.

In one example of an electronic device die, the perimeter has a shape that maximizes perimeter length for a given area.

In one example of an electronic device die, the shape is a polygon.

In one example of an electronic device die, the shape is an ellipse.

In one example of an electronic device die, the shape is a circle.

In one example, there is provided, an electronic device package comprising a substrate having a top surface configured to receive a die and a bottom surface opposing the top surface, a die having a top surface and a bottom surface opposing the top surface, said die coupled to the top surface of the substrate, wherein at least one of the top surface and the bottom surface of either the substrate, or the die, or both has a non-rectangular shaped perimeter.

In one example of an electronic device package, the substrate further comprises electronic circuitry.

In one example of an electronic device package, the non-rectangular perimeter of either the substrate, the die, or both comprises a circular shape, a semi-circular shape, an elliptical shape, a polygonal shape, a curvilinear shape, a free form shape, or a combination thereof.

In one example of an electronic device package, the polygonal shape comprises a triangular shape, a pentagonal shape, a hexagonal shape, a heptagonal shape, an octagonal shape, or a combination thereof.

In one example of an electronic device package, the polygonal shape is a triangular shape.

In one example of an electronic device package, the shape minimizes areas of lost electrical contact between the die and the substrate, or between the substrate and a motherboard to which the substrate is coupled due to thermally induced warping of the die or the substrate.

In one example of an electronic device package, the area of lost electrical contact is along a periphery of the die or the substrate.

In one example of an electronic device package, the shape of the die or the substrate is selected in order to maximize a number of dies or substrates harvested from a single wafer or panel.

In one example of an electronic device package, the perimeters of the top and bottom surfaces of the substrate or of the die match in shape and size.

In one example of an electronic device package, the perimeters of the top and bottom surfaces of the substrate or of the die differ in shape or size.

In one example of an electronic device package, the substrate and die have substantially matching perimeter shapes.

In one example of an electronic device package, the substrate and die have different perimeter shapes.

In one example of an electronic device package, the die comprises a plurality of dies.

In one example of an electronic device package, the non-rectangular perimeter of each die has a shape configured to maximize the number of dies coupled to the substrate or to a motherboard.

In one example of an electronic device package, the shapes of the dies are complementary.

In one example of an electronic device package, the shapes of the dies substantially match.

In one example of an electronic device package, the shapes of the dies are different.

In one example of an electronic device package, the perimeter of the substrate, or the die, or both is a shape that maximizes perimeter length for a given area.

In one example of an electronic device package, the shape is a polygon.

In one example of an electronic device package, the shape is an ellipse.

In one example of an electronic device package, the shape is a circle.

In one there is provided, an electronic device comprising an electronic device package as disclosed herein coupled to a motherboard.

In one example of an electronic device, the motherboard has a non-rectangular perimeter shape.

In one example of an electronic device, the non-rectangular perimeter of the motherboard comprises a circular shape, a semi-circular shape, an elliptical shape, a polygonal shape, a curvilinear shape, a free form shape, or a combination thereof.

In one example of an electronic device, the polygonal shape of the motherboard comprises a triangular shape, a pentagonal shape, a hexagonal shape, a heptagonal shape, an octagonal shape, or a combination thereof.

In one example of an electronic device, the electronic device package comprises a plurality of electronic device packages.

In one example of an electronic device, the non-rectangular perimeter of the substrate of each electronic device package has a shape configured to maximize the number of electronic device packages coupleable to the motherboard.

In one example of an electronic device, the perimeter shapes of the substrates are complementary.

In one example of an electronic device, the perimeters of the top and bottom surfaces match in shape and size.

In one example of an electronic device, the perimeters of the top and bottom surfaces differ in shape or size.

In one example of an electronic device, the electronic device can further comprise a processor, a memory, an input/output (I/O), a connector, a socket, or a combination thereof.

In one example of an electronic device, the electronic device comprises a desktop computer, a laptop computer, a tablet computer, a smartphone, a smartwatch, a server, or a combination thereof.

In one example there is provided, a method of maximizing use of a rectangular panel or a round wafer in producing electronic device substrates or dies comprising selecting at least one non-rectangular perimeter shape and size for the substrates or dies that is sufficient for use in an electronic device package into which the substrate or die is to be incorporated, identifying a maximum number of the substrate units that fit on a surface of the rectangular panel or a maximum number of the die units that fit on a surface of the round wafer, and forming the substrates from the panel or the dies from the wafer.

In one example of a method for maximizing use of a wafer, the non-rectangular perimeter shape comprises a circular shape, a semi-circular shape, an elliptical shape, a polygonal shape, a curvilinear shape, a free form shape, or a combination thereof.

In one example of a method for maximizing use of a wafer, the polygonal shape comprises a triangular shape, a pentagonal shape, a hexagonal shape, a heptagonal shape, an octagonal shape, or a combination thereof.

In one example of a method for maximizing use of a wafer, the polygonal shape is a triangle.

In one example of a method for maximizing use of a wafer, the substrate or die units have a substantially same shape or size, or both shape and size.

In one example of a method for maximizing use of a wafer, the substrate or die units have substantially different shapes, or sizes, or both shapes and sizes.

In one example of a method for maximizing use of a wafer, identifying a maximum number of substrate units that fit on a surface of the rectangular panel or a maximum number of die units that fit on a surface of the round wafer comprises orienting units of the selected shape(s) and size(s) in relation to the panel or wafer surface.

In one example of a method for maximizing use of a wafer, at least one substrate unit is suitable for use as an embedded multi-die interconnect bridge (EMIB).

In one example there is provided, a method of making an electronic device package can comprise providing a die, providing a substrate, and coupling the die to the substrate, wherein either the die, the substrate, or both have a non-rectangular shaped perimeter.

In one example of a method of making an electronic device package, the non-rectangular shaped perimeter comprises a circular shape, a semi-circular shape, an elliptical shape, a polygonal shape, a curvilinear shape, a free form shape, or a combination thereof.

In one example of a method of making an electronic device package, the polygonal shape comprises a triangular shape, a pentagonal shape, a hexagonal shape, a heptagonal shape, an octagonal shape, or a combination thereof.

In one example of a method of making an electronic device package, the polygonal shape is a triangle.

In one example of a method of making an electronic device package, the die has a non-rectangular perimeter shape.

In one example of a method of making an electronic device package, the substrate has a non-rectangular perimeter shape.

In one example of a method of making an electronic device package, both the die and the substrate have a non-rectangular perimeter shape.

In one example of a method of making an electronic device package, the die comprises a plurality of dies and the non-rectangular shaped perimeter of each die is configured to maximize the number of dies coupled to the substrate.

In one example there is provided, a method of maximizing a number of electronic device packages on a motherboard comprising selecting a size and shape for the motherboard, selecting electronic device package configurations with non-rectangular shaped perimeters having complementary shapes that combine to form a shape that maximizes a density of the electronic device packages on the motherboard, and mounting the electronic device packages on the motherboard.

In one example of a method of making an electronic device package, the non-rectangular perimeter of the electronic device package configurations can comprise a circular shape, a semi-circular shape, an elliptical shape, a polygonal shape, a curvilinear shape, a free form shape, or a combination thereof.

In one example of a method of making an electronic device package, the polygonal shape comprises a triangular shape, a pentagonal shape, a hexagonal shape, a heptagonal shape, an octagonal shape, or a combination thereof.

In one example of a method of making an electronic device package, the motherboard has a rectangular perimeter shape.

In one example of a method of making an electronic device package, the motherboard has a non-rectangular perimeter shape.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic semiconductor device package, comprising:
   a printed circuit board substrate having a top surface configured to receive a die and a bottom surface opposing the top surface;
   a die having a top surface and a bottom surface opposing the top surface, said die coupled to the top surface of the substrate;
   wherein at least one of the top surface and the bottom surface of the substrate and the die have non-rectangular shaped perimeters, and
   wherein the perimeters of the top and bottom surfaces of the substrate or of the die differ in shape or size.

2. The electronic semiconductor device package of claim 1, wherein the non-rectangular shaped perimeters of the substrate and the die comprise a circular shape, a semi-circular shape, an elliptical shape, a polygonal shape, a curvilinear shape, a free form shape, or a combination thereof.

3. The electronic semiconductor device package of claim 1, wherein the shape minimizes areas of lost electrical contact between the die and the substrate, or between the substrate and a motherboard to which the substrate is coupled due to thermally induced warping of the die or the substrate.

4. The electronic semiconductor device package of claim 1, wherein the shape of the die or the substrate is selected in order to maximize a number of dies or substrates harvested from a single wafer or panel.

5. The electronic semiconductor device package of claim 1, wherein the perimeters of the top and bottom surfaces of the substrate or of the die match in shape and size.

6. The electronic semiconductor device package of claim 1, wherein the substrate and die have substantially matching perimeter shapes.

7. The electronic semiconductor device package of claim 1, wherein the substrate and die have different perimeter shapes.

8. The electronic semiconductor device package of claim 1, wherein the die comprises a plurality of dies.

9. The electronic semiconductor device package of claim 1, wherein the perimeter of the substrate, or the die, or both is a shape that maximizes perimeter length for a given area.

10. The electronic semiconductor device package of claim 8, wherein the top surface and the bottom surface of each of the plurality of dies has a non-rectangular shaped perimeter.

* * * * *